United States Patent [19]

Williams

[11] Patent Number: 4,497,042

[45] Date of Patent: Jan. 29, 1985

[54] MAGNETIC BUBBLE LOGIC APPARATUS

[75] Inventor: Richard P. Williams, Columbia, Md.

[73] Assignee: The United States of America as represented by the Director of the National Security Agency, Washington, D.C.

[21] Appl. No.: 533,473

[22] Filed: Sep. 19, 1983

Related U.S. Application Data

[63] Continuation of Ser. No. 251,664, Apr. 6, 1981, Pat. No. 4,435,783.

[51] Int. Cl.³ .............................................. G11C 19/08
[52] U.S. Cl. .......................................... 365/5; 365/43
[58] Field of Search ................................ 365/5, 39, 43

[56] References Cited

U.S. PATENT DOCUMENTS 3,723,716  3/1973  Bobeck et al. ........................... 365/5
4,117,543  9/1978  Minnick et al. ........................... 365/5
4,200,924  4/1980  Ishihara et al. .......................... 365/5

Primary Examiner—James W. Moffitt
Attorney, Agent, or Firm—Thomas O. Maser; John R. Utermohle

[57] ABSTRACT

An apparatus for controllable propagation of magnetic domains, or bubbles, through an arrangement of closely spaced magnetic propagating elements arranged in an input stage, a strip-former stage, and a decoder stage. Binary logic circuitry results from selective control of bubble movement through alternate paths of elements, with at least one of said paths producing a domain strip extending the full height of the strip-former stage. The decoder stage includes a propagating element spaced apart from the strip-former stage a distance sufficient to prevent propagation of all domains in the strip-former stage except for the full-height strip. The asymmetric geometry of the strip former stage makes the full elongation of a bubble dependent upon which input provided the bubble.

5 Claims, 6 Drawing Figures

MAGNETIC BUBBLE LOGIC APPARATUS

This is a continuation of application Ser. No. 251,664 filed Apr. 6, 1981, now U.S. Pat. No. 4,435,783.

BACKGROUND OF THE INVENTION

1. Field of the Invention

This invention relates to the field of electrical signal control, and more specifically to binary logic gates for magnetic bubble circuits.

2. Description of the Prior Art

Technology related to storage and propagation of magnetic bubbles has existed for a number of years and is well documented in the prior art. The term "magnetic bubbles" refers to small domains of reversed magnetization which exist in certain uniaxial magnetic thin films when a bias field of appropriate magnitude is applied. Storage and propagation of the bubbles is possible by arranging magnetically permeable thin film elements on a substrate to form a path for the bubbles, which propagate along the path in response to a rotating field. Proven advantages of magnetic bubble circuits include high bit packing density, low power consumption, low cost, and high reliability.

While bubble storage and propagation technology is rather well developed, the use of this technology to create effective binary logic gates has been less successful. A logic gate must provide alternative paths for bubble propagation such that bubble interaction determines which of the alternate paths is taken. Typically a propagation path will branch into "hard" and "easy" paths, with a bubble traversing the "easy" path in the absence of any interaction. The difficulty with such gate designs is that the "hard" path tends to collapse bubbles, and thus establishes an upper limit for the bias field. At the path junction, bubbles tend to strip-out between the alternate paths, thereby establishing a lower limit for the bias field. Strip-out refers to an elongation of a bubble across several adjacent path elements, and is conventionally regarded as a device failure. The device operating margin is the difference between the upper and lower operating limits on the bias field, and for prior art bubble logic gates this margin is undesirably small.

Another difficulty of prior art logic devices arises from the presence of a strong interaction force between the bubbles and individual propagation patterns, which tends to overpower the bubble-to-bubble interaction force. Bubbles thus must be brought very close together in order to obtain logic action; the close spacing leads to bubble collapse at high bias, and bubble strip-out failure at low bias. Disclosures illustrating logic gates with provision for close bubble interaction include U.S. Pat. Nos. 4,117,543 to Minnick and 3,723,716 to Bobeck et al. Both teach wide columnar structures of chevrons, but their close chevron spacing makes the gates so susceptible to strip-out that they cannot be operated in a normal bias range.

In order to reduce the force exerted on a bubble by the propagation paths, a logic gate can utilize thick spacing between the bubble material and the permalloy propagation patterns. This causes the permissible propagation speeds to be substantially reduced, and the use of circuits containing passive bubble replicators is rendered impractical.

An alternative scheme for bubble logic is disclosed in U.S. Pat. No. 4,200,924 to Ishihara et al., which includes chevron columns wherein the vertical distance between adjacent chevrons is gradually increased along the propagation path and the chevron width is gradually decreased. Strip-out is allowed to occur in those cases where only a single bubble is provided into the circuit, and the strip is subsequently converted back into a bubble on a predetermined path by a taffy-pulling arrangement. That is, as the strip becomes excessively elongated by the continuously widening chevron gaps, it eventually breaks off from the narrow chevrons and consolidates on the wider center element. This approach requires an abnormally high bias field to aid in detaching the ends of the strip. This high bias tends to collapse bubbles on the narrow chevrons when two bubbles are input simultaneously. Further, propagation speed in this device is undesirably limited due to the large vertical spacing of the chevron elements which provide only a low density of magnetic poles along the length of an elongated strip domain.

SUMMARY OF THE INVENTION

The strip-out phenomenon which conventionally is responsible for failures in bubble devices can be used to advantage in the design of bubble logic gates. Rather than attempt to suppress strip-out, bubble domain interactions are accomplished in a strip-former stage where the interaction is simple and reliable. The strip-former is capable of elongating a single domain into a strip which occupies the full height of the stage. In a symmetric strip-former a single bubble provided to either input will form such a full height strip, but in a strip-former with asymmetric geometry the full elongation of a bubble will depend on which input provided the bubble. In either type of strip-former, two bubbles simultaneously input to the device will interact so that neither bubble forms a full-height strip. The strip forming stage functions to encode bubble interaction as the absence of a full-height strip, and in the asymmetric case absence of a strip depends further on the bubble input location.

A variety of logic functions can be produced from the output of the strip-former stage by a decoding arrangement in a subsequent decoding stage. The decoding stage contains one or more bubble propagation elements which are spaced or shaped to inhibit the propagation of either a bubble or a strip domain. A chevron propagation element will inhibit bubble propagation if it is spaced from the strip former by a relatively wide gap, but the center of a strip can cross the wide gap if the strip ends are held to prevent contraction of the strip. Other propagation elements termed "discriminators" propagate bubbles while inhibiting propagation of a strip end. Discriminators are designed to provide a field gradient which will propagate bubbles, but with insufficient field magnitude to permit the domain elongation needed for propagation of a strip end.

Bubble logic gates in which bubbles are neither created nor destroyed are termed "conservative" gates, Non-conservative logic gates can be made by including bubble replicators (strip cutters) or annihilators in the gate structure. Whenever a strip is output from the strip former stage, that strip may be cut by cutting elements located either in the strip forming stage or in the decoding stage. When strips are cut, ordinary propagation elements rather than discriminators may be used for output of the bubbles generated from the strip ends. Bubbles output from the strip former stage may be destroyed (collapsed) by annihilators located either in the strip former stage or in the decoder stage. Annihilators located in the strip former serve both to annihilate bubbles and to hold strip ends while the center of a strip crosses a wide gap.

All bubble logic gates in my invention use a common type of bubble interaction. This interaction occurs between elongated bubble domains, and the exact position of the interacting domain ends is not critical. The parallel propagation paths are not required to be closely spaced, and the spacing can be sufficiently large to accommodate three output propagation paths. Within the normal range of bias field, it is physically impossible for the domain interaction to be encoded improperly, since two domains cannot simultaneously occupy the same position. The critical design issues relate to the nature of bubble and strip propagation in the decoder section, and the decoder operation benefits from the absence of bubble interaction in that section.

Accordingly, it is an object of my invention to provide a binary logic circuit which overcomes the many disadvantages of the prior art.

It is a further object to provide a logic gate capability in an apparatus for the propagation of magnetic bubbles.

Still another object is to provide a logic gate apparatus in which the bubble domain interaction function is distinct from the output logic determination function.

Another object is to provide a multi-stage bubble propagation apparatus.

A further object is to provide bubble logic apparatus utilizing asymmetrical arrangements of propagating elements.

A still further object is to utilize the phenomena of strip-out to advantage in bubble logic.

Another object is to provide bubble logic gates of small size which are capable of high speed operation.

It is also an object to provide bubble logic capable of operating reliably over a useful range of bias field.

An apparatus having these and other advantages would include an input stage including inputs for receiving one or more bubbles, an asymmetrical strip-former stage adjacent the input stage and including a plurality of propagating elements vertically spaced so as to produce a strip extending the full height of said strip-former stage when a bubble is provided only to the first input and to form a less than full height strip when a bubble is provided only the second input, and a decoding stage having a first output propagating element spaced apart from said strip former a distance sufficient to prevent propagation of all but said full-height strip onto said first output element.

BRIEF DESCRIPTION OF THE DRAWINGS

Other objects and the many advantages of my invention will be apparent as it becomes better understood by reading the description which follows together with the drawings, in which.

DESCRIPTION OF THE PREFERRED EMBODIMENTS

Figure 1A:
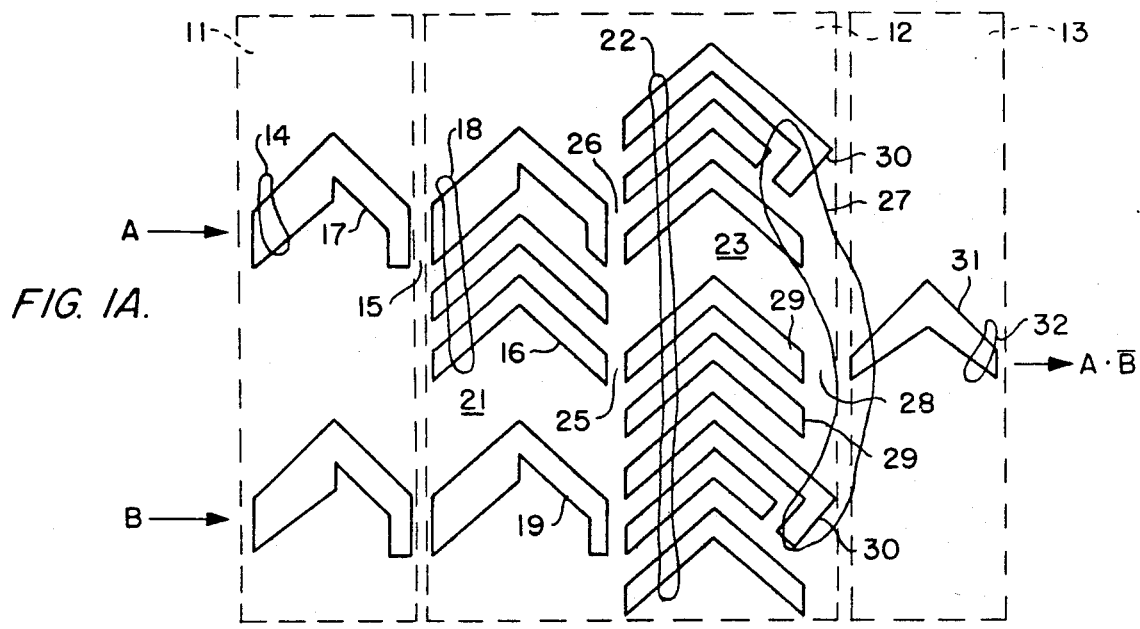
FIGS. 1A–1C illustrate a first example of a bubble logic apparatus, including an asymmetrical strip-former stage.

Referring to FIG. 1A, there is illustrated a representative magnetic bubble logic circuit having the desirable characteristics of my invention. The circuit includes an input stage 11, followed in sequence by a strip-former stage 12 and a decoding stage 13. It will become apparent upon further reading that the input stage may take many forms and need not necessarily exist as a distinct separate stage in all cases. Specifically, the input stage might be the decoder stage of a prior logic gate in an apparatus where more than one logic gate is placed end to end. The stages include propagating elements of various types and shapes, such as element 16 which is commonly designated a chevron and element 17, called an asymmetric chevron. A customary use of asymmetric chevrons is to form propagation paths connecting logic gates.

Inputs A and B are conventional means (not shown), through which it is made possible to provide a bubble into the apparatus at point A, point B, or both. FIG. 1A specifically illustrates the case where a bubble has been provided at point A only. Bubble 14 propagates across element 17 and jumps gap 15 into the strip-former stage 12, where it elongates vertically into a strip 18. The vertical gap 21 is too great to allow strip 18 to extend further to element 19. The rotating magnetic field causes strip 18 to propagate to the right in a conventional manner until it crosses gaps 25 and 26 as illustrated by strip 22. Vertical gap 23 is spanned by strip 22 because of the prior elongation of strip 18, which does not contract as it crosses gaps 25 and 26. Further elongation results in a strip which extends the full height of the strip-former stage 12. As strip 22 continues propagating to the right it reaches the position illustrated by strip 27. A wide horizontal gap 28 separates stages 12 and 13. What constitutes a wide gap will necessarily be dependent upon the operating bias. For purposes of this description, a wide gap may be defined as one at least wide enough to prohibit propagation of a bubble domain (as opposed to a strip domain) at the operating bias field.

Strip 27, which is held at its ends by annihilator elements 30—30, bows in the middle as a result of repulsion by elements 29—29 and attraction by element 31. As a result, the center of strip 27 propagates across gap 28 onto element 31, the annihilator elements release the strip ends, and the strip shrinks to a bubble on element 31. The bubble 32 is seen at the output of the apparatus, ready for use as an input signal to a similar device or propagation element. It is thus seen that a bubble provided only to the A input causes a bubble to appear at the device output, consistent with the logic function A·B̄.

Figure 1B:
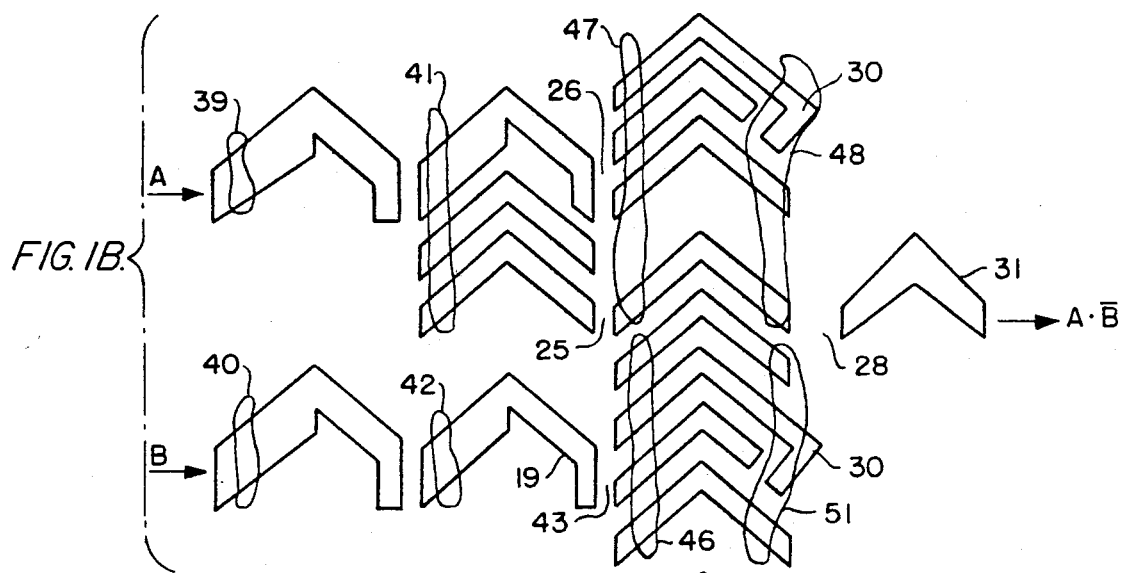

FIG. 1B shows an apparatus identical to that of FIG. 1A, except that a bubble has been provided at input B as well as at input A. The bubble 39 from input A forms a strip 41 as previously illustrated in FIG. 1A, while the bubble 40 from input B propagates as bubble 42 on element 19. As bubble 42 reaches the right-most end of element 19, it easily jumps gap 43 and elongates into strip 46. Strip 41 similarly propagates to the right and crosses gaps 25 and 26; however, the mutual repulsive forces between the two magnetic domains 46 and 47 maintains a small separation between the two strips as illustrated. Each strip continues to propagate to the right as illustrated by strips 48 and 51, at which point neither is able to cross to element 31 due to mutual repulsion and the large distance across gap 28. Both strips shrink into the annihilator elements 30—30, and are collapsed, with the result that no bubble appears on element 31. This again, is consistent with the operation of the A·B̄ logic function.

Figure 1C:
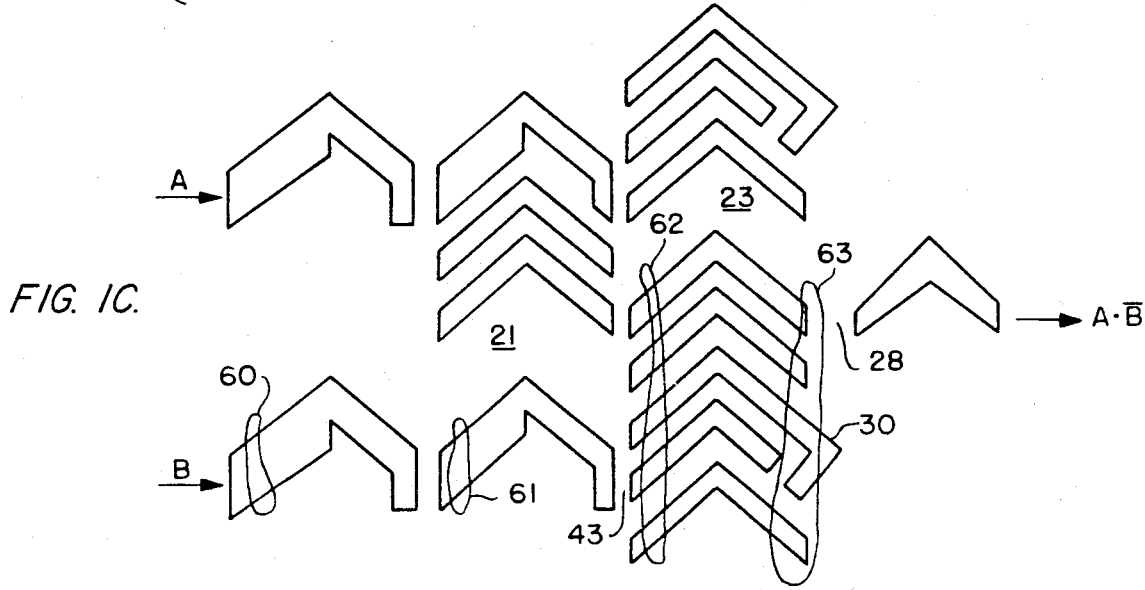

FIG. 1C shows the last example illustrating the apparatus of FIGS. 1A and 1B, with a bubble 60 provided only at input B. Bubble 61, unable to form a strip because of gap 21, propagates to the right and jumps the gap 43. It elongates into strip 62, but is unable to elongate further because of gap 23. It continues to propagate to the right until it reaches the position illustrated by strip 63, where it is unable to jump gap 28 and is collapsed by annihilator element 30.

The three examples illustrated in FIGS. 1A–1C demonstrate that the apparatus performs the logic function A·B̄. This result is achieved by a three stage device utilizing strip-out, vertical propagation element spacing, and mutual domain repulsion to selectively produce the presence or absence of a strip extending the full height of the strip-former stage. A wide horizontal gap separates the propagation elements of the strip-former stage from an element in the decoder stage, the gap being sufficiently wide to inhibit propagation of any but the full-height strip onto the decoder element.

Figure 2A:
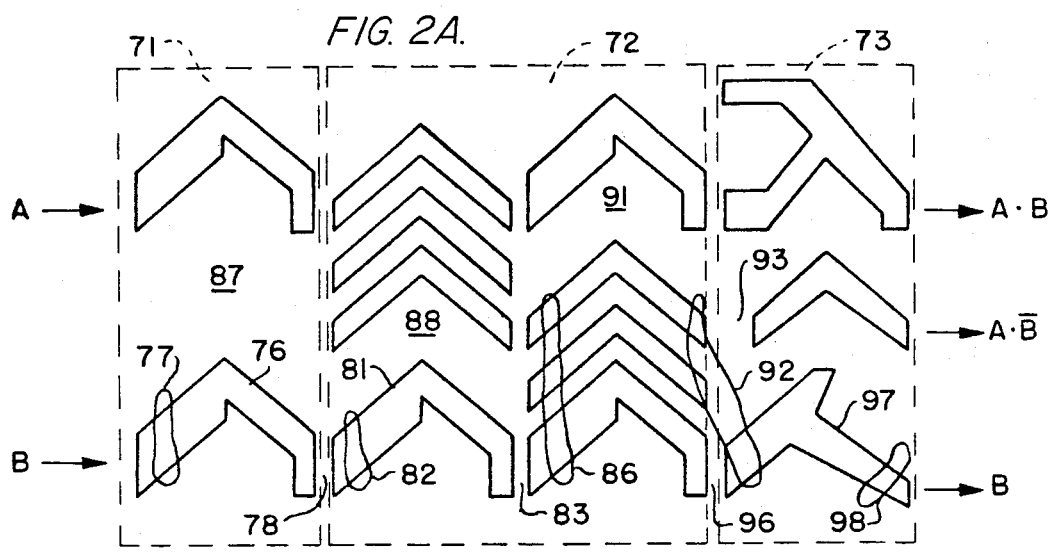
FIGS. 2A–2C illustrate a second asymmetrical bubble logic apparatus, having multiple outputs.
Figure 2B:
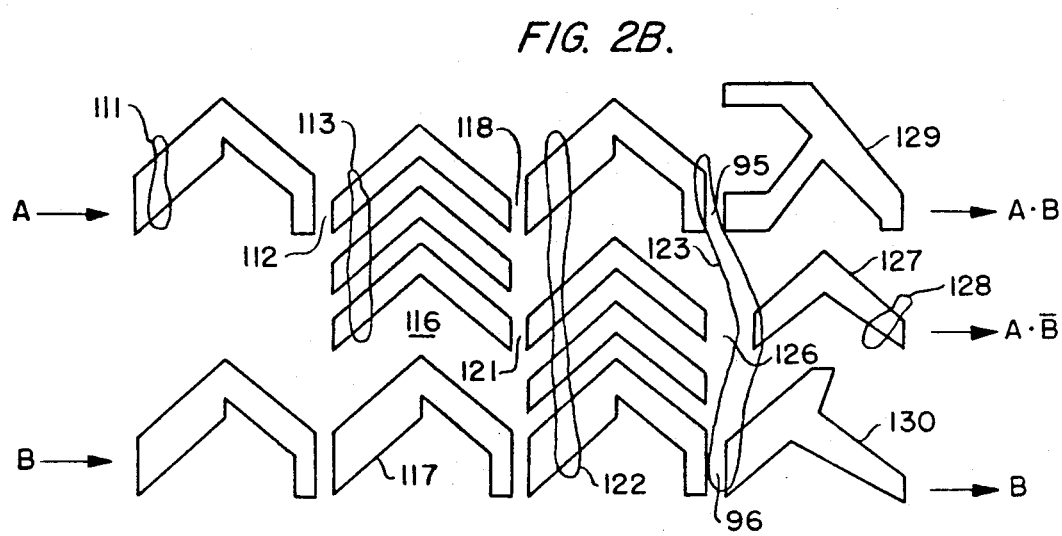
Figure 2C:
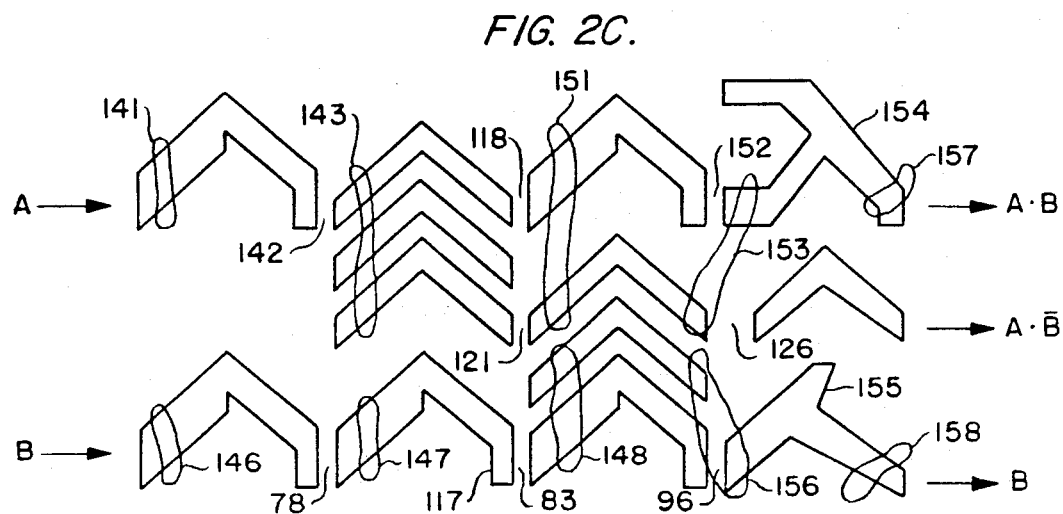

FIGS. 2A–2C illustrate another example of my invention, in which an asymmetrical strip former stage and multiple decoder stage elements are combined in an apparatus which provides the logic functions A·B, A·B̄ and B.

Referring to FIG. 2A, there are seen an input stage 71, a strip-former stage 72 and a decoder stage 73. A domain provided at input B propagates across element 76 as bubble 77, crosses the small gap 78 to element 81 as illustrated by bubble 82, and crosses the small gap 83 to elongate into strip 86. The larger vertical gaps at 87, 88 and 91 prevent elongation of bubbles 77 and 82 and of strip 86 beyond the extent illustrated. When strip 92 reaches the point indicated, it is unable to jump the large horizontal gap 93 but easily jumps the small gap 96 to cross element 97 and appear as bubble 98 on the B output.

FIG. 2B illustrates the operation of the apparatus of FIG. 2A when a bubble is provided only at the A input. Bubble 111 crosses small gap 112 and elongates into strip 113. The large vertical gap 116 prevents strip 113 from elongating further onto element 117, but as it reaches small gaps 118 and 121, strip 113 easily crosses both and elongates into strip 122. This full-height strip propagates to the right to the position illustrated by strip 123, where the center of the strip crosses the large horizontal gap 126 and attaches to element 127. The outer ends of strip 123 initially cross the small gaps 95 and 96 and attach to discriminator elements 129 and 130 in the decoder stage. These elements are shaped to promote propagation of a bubble but to inhibit propagation of strip ends. As a result, the ends detach from the discriminator elements and the strip shrinks to bubble 128 at the A·B̄ output.

FIG. 2C illustrates the case for bubbles provided at both the A and B inputs. Bubble 141 crosses gap 142 and elongates into strip 143, as bubble 146 crosses gap 78 to appear as bubble 147 on element 117. Domains 143 and 147 each propagate to the right where bubble 147 crosses gap 83 and strip 143 crosses gaps 118 and 121. Mutual repulsion, together with the large size of gap 126, prevents either of domains 148 or 151 from crossing gap 126, so no domain appears at the A·B̄ output. However, the end of strip 151 readily crosses gap 152, and strip 153 shrinks to provide a bubble 157 which propagates on discriminator 154 to the A·B output. Domain 156 crosses gap 96 to provide a bubble 158 which propagates on discriminator 155 to the B output.

It is readily apparent from the above embodiments that my invention is susceptible to any number of modifications, and I do not intend that my invention be limited to the specific examples shown. Instead, it is my intent that my invention be limited only as set forth in the appended claims.

I claim:

1. An apparatus for propagation for magnetic bubbles, comprising:
    an input stage including first and second inputs for receiving one or more bubbles;
    an asymmetric strip-former stage adjacent the input stage and including a plurality of propagating elements vertically spaced so as to produce a strip extending the full height of said strip-former stage when a bubble is provided only to a first input and to form a less than full height strip when a bubble is provided only to a second input, and
    a decoding stage having a first output propagating element spaced apart from said strip former a distance sufficient to prevent propagation of all but said full-height strip onto said first output element.

2. The apparatus of claim 1 wherein said decoding stage further includes one or more additional propagating elements.

3. The apparatus of claim 2 wherein said additional elements are shaped to inhibit strip domain propagation.

4. The apparatus of claim 1 wherein said strip-former stage further includes an annihilator element.

5. The apparatus of claim 1 wherein said plurality of elements are vertically spaced such that bubble interaction will prevent formation of a full height strip when a bubble is provided simultaneously to both inputs.

* * * * *